(12) United States Patent
Bauer et al.

(10) Patent No.: US 9,881,909 B2
(45) Date of Patent: Jan. 30, 2018

(54) METHOD FOR ATTACHING A SEMICONDUCTOR DIE TO A CARRIER

(71) Applicant: Infineon Technologies AG, Neubiberg (DE)

(72) Inventors: Michael Bauer, Nittendorf (DE); Ludwig Heitzer, Falkenfels (DE); Christian Stuempfl, Schmidgaden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/926,892

(22) Filed: Oct. 29, 2015

(65) Prior Publication Data

US 2016/0126227 A1 May 5, 2016

(30) Foreign Application Priority Data

Oct. 31, 2014 (DE) ........................ 10 2014 115 882

(51) Int. Cl.
  *H01L 21/4763* (2006.01)
  *H01L 25/16* (2006.01)
  (Continued)

(52) U.S. Cl.
  CPC ............ *H01L 25/16* (2013.01); *H01L 21/022* (2013.01); *H01L 21/02164* (2013.01); *H01L 21/02266* (2013.01); *H01L 21/78* (2013.01); *H01L 23/485* (2013.01); *H01L 24/94* (2013.01); *H01L 25/04* (2013.01); *H01L 25/50* (2013.01); *H01L 24/27* (2013.01); *H01L 24/32* (2013.01); *H01L 24/83* (2013.01); *H01L 2224/273* (2013.01);
  (Continued)

(58) Field of Classification Search
  CPC ............. H01L 21/02164; H01L 21/022; H01L 21/02266; H01L 21/78; H01L 23/485; H01L 24/94; H01L 25/04; H01L 25/16; H01L 25/50
  USPC ....... 257/106, 121, 123, 618, 666, 676, 685, 257/773; 438/106, 121, 123, 618, 666
  See application file for complete search history.

(56) References Cited

U.S. PATENT DOCUMENTS 6,306,680 B1 * 10/2001 Fillion ................ H01L 23/3121
  257/E21.508
2002/0190317 A1  12/2002 Mukherjee et al.
(Continued)

FOREIGN PATENT DOCUMENTS

CN    103839842 A    6/2014
DE     10149774 A1   4/2003
DE    102013114059 A1   6/2014

*Primary Examiner* — Hung Vu
(74) *Attorney, Agent, or Firm* — Murphy, Bilak & Homiller, PLLC (57) ABSTRACT

A method for fabricating an electronic device includes providing a first semiconductor chip and a second semiconductor chip. The first semiconductor chip has a first semiconductor die and a first solder interconnect layer applied to a main face of the first semiconductor die. The second semiconductor chip has a second semiconductor die, an insulating layer applied to a main face of the second semiconductor die, and a second solder interconnect layer applied to the insulating layer. The method further includes attaching the first semiconductor chip with the first solder interconnect layer to a first carrier and attaching the second semiconductor chip with the second solder interconnect layer to a second carrier.

10 Claims, 4 Drawing Sheets

(51) Int. Cl.
*H01L 23/485* (2006.01)
*H01L 21/02* (2006.01)
*H01L 21/78* (2006.01)
*H01L 25/00* (2006.01)
*H01L 25/04* (2014.01)
*H01L 23/00* (2006.01)

(52) U.S. Cl.
CPC .. *H01L 2224/274* (2013.01); *H01L 2224/291* (2013.01); *H01L 2224/3201* (2013.01); *H01L 2224/32225* (2013.01); *H01L 2224/83801* (2013.01); *H01L 2224/94* (2013.01); *H01L 2924/1203* (2013.01); *H01L 2924/1306* (2013.01); *H01L 2924/13055* (2013.01); *H01L 2924/13091* (2013.01); *H01L 2924/14* (2013.01); *H01L 2924/1431* (2013.01); *H01L 2924/206* (2013.01); *H01L 2924/2064* (2013.01)

(56) References Cited

U.S. PATENT DOCUMENTS

| | | |
|---|---|---|
| 2005/0006758 A1 | 1/2005 | Wolf et al. |
| 2008/0173992 A1 | 7/2008 | Mahler et al. |
| 2009/0160046 A1 | 6/2009 | Otremba et al. |
| 2012/0319254 A1* | 12/2012 | Kikuchi ............. H01L 23/5389 257/659 |
| 2014/0167266 A1 | 6/2014 | Schneegans et al. |

* cited by examiner

FIG 4

METHOD FOR ATTACHING A SEMICONDUCTOR DIE TO A CARRIER

PRIORITY CLAIM

This application claims priority to German Patent Application No. 10 2014 115 882.2 filed on 31 Oct. 2014, the content of said application incorporated herein by reference in its entirety.

TECHNICAL FIELD

The present disclosure relates to a method for fabricating an electronic device, a method for attaching a semiconductor die to a carrier, and an electronic device.

BACKGROUND

When fabricating electronic devices or electronic modules very often semiconductor chips with backside electrical contact pads as well as semiconductor chips without backside electrical contact pads have to be attached to carriers. The semiconductor chips with backside electrical contact pads are, for example, chips comprising vertical transistor structures as, for example, insulated gate bipolar (IGB) transistors. The semiconductor chips without backside electrical contact pads are, for example, logic chips or controller chips. For attaching these different semiconductor chips to carriers, different non-compatible process steps are necessary which are characterized by different thermal load conditions which means that they have to be separated and also materials have to be selected accordingly.

SUMMARY

According to an embodiment of a method for fabricating an electronic device, the method comprises: providing a first semiconductor chip, the first semiconductor chip comprising a first semiconductor die and a first solder interconnect layer applied to a main face of the first semiconductor die; providing a second semiconductor chip, the second semiconductor chip comprising a second semiconductor die, an insulating layer applied to a main face of the second semiconductor die, and a second solder interconnect layer applied to the insulating layer; and attaching the first semiconductor chip with the first solder interconnect layer to a first carrier and attaching the second semiconductor chip with the second solder interconnect layer to a second carrier.

According to an embodiment of a method for attaching a semiconductor die to a carrier, the method comprises: providing a semiconductor die, the semiconductor die comprising a first main face and a second main face opposite to the first main face and at least one electrical contact element on the first main face; applying an insulating layer onto the second main face of the semiconductor die; applying a solder interconnect layer onto the insulating layer; and attaching the semiconductor die with the solder interconnect layer to a carrier.

According to an embodiment of a method for fabricating semiconductor chips, the method comprises: providing a plurality of semiconductor dies on a semiconductor wafer, the semiconductor dies each comprising a first main face and a second main face opposite to the first main face and at least one electrical contact element on the first main face; applying an insulating layer onto the second main faces of the semiconductor dies; applying a solder interconnect layer onto the insulating layer; and singulating the semiconductor wafer to obtain a plurality of separated semiconductor chips.

According to an embodiment of an electronic device, the electronic device comprises a first carrier, a second carrier, a first semiconductor die comprising at least one electrical contact element on each one of two opposing main faces, and a second semiconductor die comprising a first main face and a second main face opposite to the first main face and at least one electrical contact element on the first main face. The first semiconductor die is arranged on the first carrier such that a first solder interconnect layer is disposed between one of the main faces of the first semiconductor die and the first carrier. The second semiconductor die is arranged on the second carrier such that an insulating layer is applied onto the second main face of the second semiconductor die and a second solder interconnect layer is disposed between the insulating layer and the second carrier.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of an electronic device and a method for fabricating an electronic device may use various types of semiconductor chips or circuits incorporated in the semiconductor chips, among them logic integrated circuits, analogue integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures like, for example, IGBT (Insulated Gate Bipolar Transistor) structures or, in general, transistor or other structures or devices in which at least one electrical contact pad is arranged on a first main face of the semiconductor chip and at least one other electrical contact pad is arranged on a second main face of the semiconductor chip opposite to the first main face of the semiconductor chip.

In several embodiments layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

The semiconductor chips may comprise contact elements or contact pads on one or more of their outer surfaces wherein the contact elements serve for electrically contacting the semiconductor chips. The contact elements may have any desired form or shape. They can, for example, have the form of lands, i.e. flat contact layers on an outer surface of the semiconductor chip. The contact elements or contact pads may be made from any electrically conducting material, e.g. from a metal as aluminum, gold, or copper, for example, or a metal alloy, or an electrically conducting organic material, or an electrically conducting semiconductor material.

In the claims and in the following description different embodiments of a method for fabricating an electronic device are described as a particular sequence of processes or measures, in particular in the flow diagram. It is to be noted that the embodiments should not be limited to the particular sequence described. Particular ones or all of different processes or measures can also be conducted simultaneously or in any other useful and appropriate sequence.

Figure 1A:
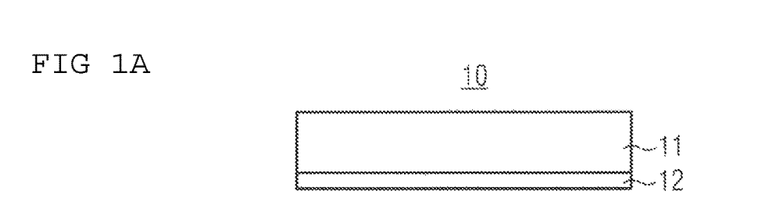
FIGS. 1A-C show schematic cross-sectional side view representations to illustrate a method for fabricating an electronic device according to an example.
Figure 1B:
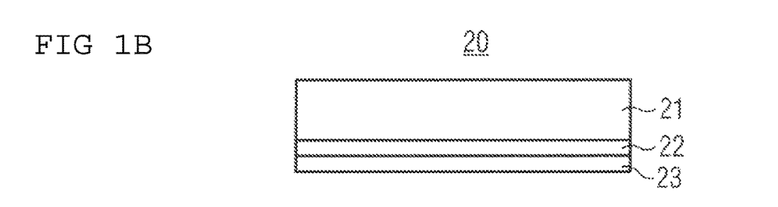
Figure 1C:
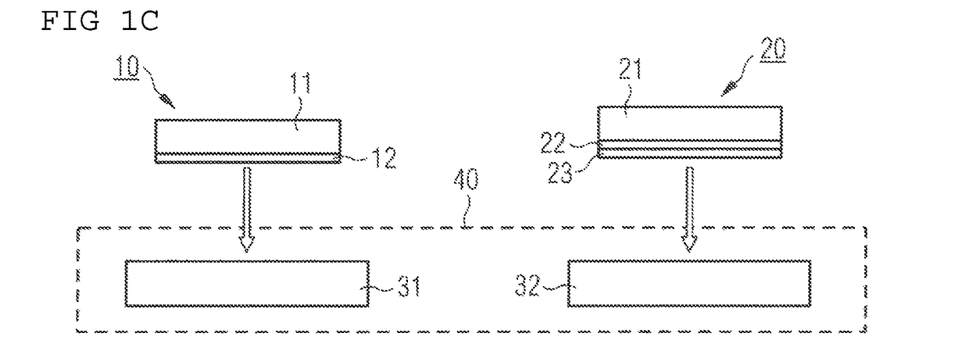

FIGS. 1A-C show schematic cross-sectional side view representations for illustrating an example of a method for fabricating an electronic device.

According to FIG. 1A, a first semiconductor chip 10 is provided wherein the first semiconductor chip 10 comprises a first semiconductor die 11 and a first solder interconnect layer 12 applied to a main face of the first semiconductor die 11.

Referring to FIG. 1B, a second semiconductor chip 20 is provided wherein the second semiconductor chip 20 comprises a second semiconductor die 21, an insulating layer 22 applied to a main face of the second semiconductor die, and a second solder interconnect layer 23 applied to the insulating layer 22.

Referring to FIG. 1C, the first semiconductor chip 10 is attached to a first carrier 31 with the first solder interconnect layer 12, and the second semiconductor chip 20 is attached to a second carrier 32 with the second solder interconnect layer 23.

According to an example of the method of FIG. 1, the first and second carriers 31 and 32 can be part of an electronic device 40 to be fabricated. According to an example thereof and the time of attaching the first and second semiconductor chips 10 and 20 to the first and second carriers 31 and 32, the first and second carriers 31 and 32 can already be held in a fixed position relative to each other. The first and second carriers 31 and 32 may, for example, be part of one and the same leadframe.

According to an example of the method of FIG. 1, the first semiconductor die 11 comprises at least one electrical contact element on each one of two opposing main faces. According to an example thereof, the first semiconductor die 21 comprises one or more of a power transistor, a vertical transistor, an insulated gate bipolar (IGB) transistor, and a vertical diode. In case of an IGB transistor a first upper main face of the first semiconductor die 11 may comprise a source contact element and a gate contact element, and a second lower main face of the first semiconductor die 21 comprises a drain contact element.

According to an example of the method of FIG. 1, the second semiconductor die 21 comprises one or more of a logic integrated circuit, a control circuit, and a circuit configured to control a transistor. One or both of the semiconductor dies 11 and 21 may be based on Si, GaN, or SiC.

According to an example of the method of FIG. 1, one or both of the semiconductor dies 11 and 21 comprise a thickness in a range from 5 μm to 1000 μm, in particular from 30 μm to 300 μm, in particular from 50 μm to 100 μm.

According to an example of the method of FIG. 1, the insulating layer 22 of the second semiconductor chip 20 comprises a thickness in a range from 0.5 μm to 2.5 μm, in particular from 1.0 μm to 2.0 μm.

According to an example of the method of FIG. 1A, one or more of the first and second solder interconnect layers 12 and 23 comprise a thickness in a range from 0.5 μm to 1.0 μm.

According to an example of the method of FIG. 1, one or both of the first and second solder interconnect layers 12 and 23 are form as a homogenous layer of one and the same material.

According to an example of the method of FIG. 1, one or both of the first and second solder interconnect layers 12 and 23 are formed of a stack of layers of different materials.

According to an example of the method of FIG. 1, the first and second solder interconnect layers 12 and 23 are formed similar or identical. According to an example thereof, the first and second solder interconnect layers 12 and 23 are not identical but comprise a similar soldering temperature, e.g. soldering temperatures the difference between which is not more than 10% of the higher soldering temperature.

According to an example of the method of FIG. 1, the insulating layer comprises a silicon dioxide layer. According to an example thereof, the silicon dioxide layer is fabricated by either tempering or sputtering.

According to an example of the method of FIG. 1, the insulating layer comprises one or more of an insulating laminate, an insulating foil, and an insulating sheet.

According to an example of the method of FIG. 1, the second solder interconnect layer 23 covers an entire surface of the insulating layer 22.

According to an example of the method of FIG. 1, the second solder interconnect layer 23 covers a surface of the insulating layer 22 in such a way that a circumferential edge portion of the insulating layer 22 below the second semiconductor die 21 is not covered by the second solder interconnect layer 23.

Referring to FIGS. 2A-E schematic top view (A) and cross-sectional side view representations (B-E) are shown to illustrate an example of a method for fabricating a semiconductor chip so that it can be attached to a carrier.

Figure 2A:
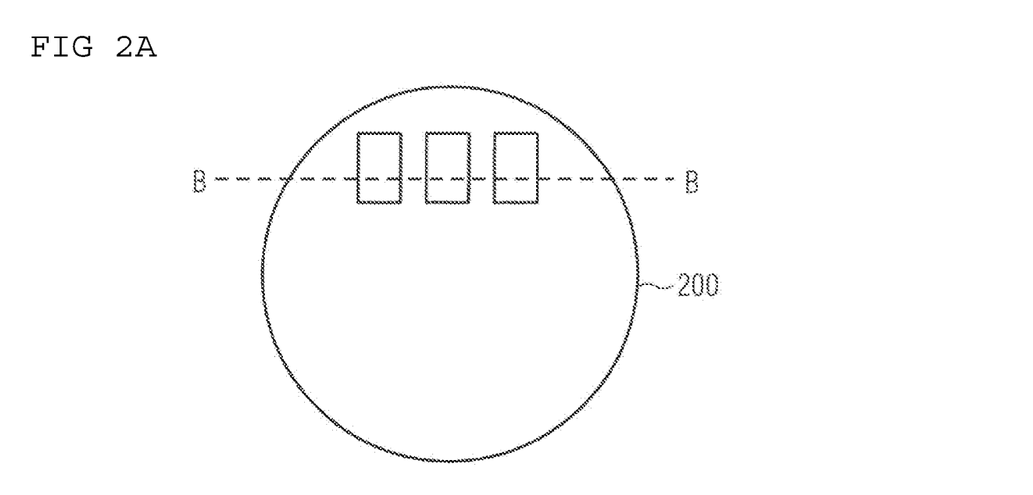
FIGS. 2A-E show schematic cross-sectional side view representations to illustrate an example of a method for fabricating a semiconductor chip so that the semiconductor chip can be attached to a carrier in an electrically insulating manner.

FIG. 2A shows a top view representation of a semiconductor wafer 200 comprising a plurality of processed semiconductor dies 210. For reasons of simplicity only a first upper row of semiconductor dies 210 is depicted. The semiconductor dies 210 are meant to correspond to the second semiconductor die 21 of FIGS. 1A-C.

Figure 2B:
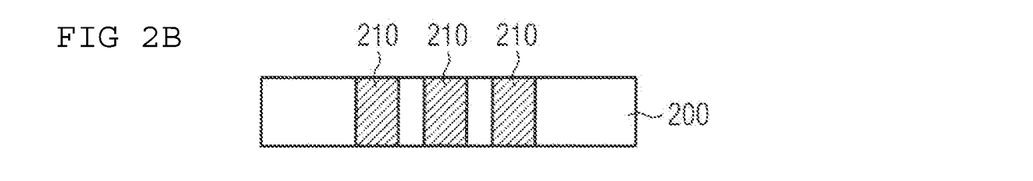

FIG. 2B shows a schematic cross-sectional side view representation of the semiconductor wafer 200 in a plane as indicated by line B-B. The semiconductor dies comprise an upper active surface having an integrated circuit incorporated therein. The upper surface of the semiconductor dies 210 may also comprise contact elements or contact pads which are not shown for reasons of simplicity.

Figure 2C:
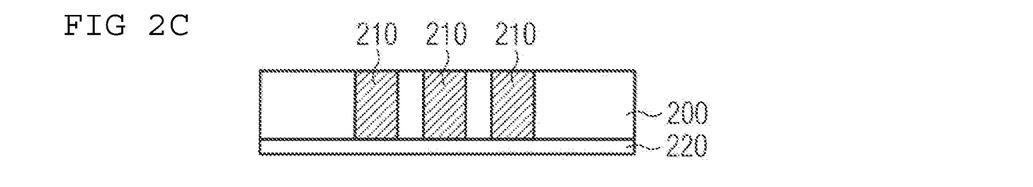

FIG. 2C shows a cross-sectional side view representation of the semiconductor wafer 200 after applying an insulating layer 220 onto the back surface of the semiconductor wafer 200 remote from the active surfaces of the semiconductor dies 210. The insulating layer 220 can be made of a silicon dioxide layer obtained by a tempering process or by sputtering. Alternatively the insulating layer 220 can be made of an insulating laminate or foil. The insulating layer 220 may have a thickness in a range from 1.0 μm to 2.0 μm.

Figure 2D:
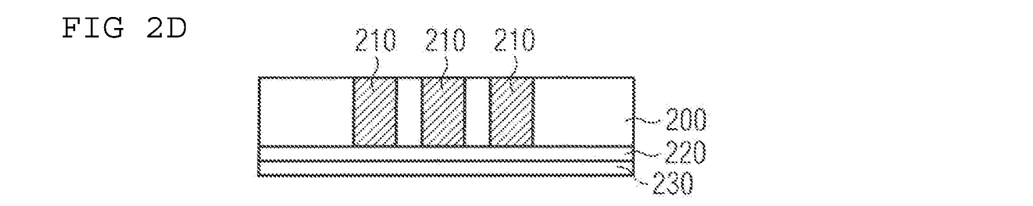

FIG. 2D shows a cross-sectional side view representation of the semiconductor wafer 200 after applying a solder interconnect layer 230 onto the entire surface of the insulating layer 220. The solder interconnect layer 230 can be made of a homogeneous layer of one and the same material or alternatively by a stack of layers of different materials. The solder interconnect layer 230 may have a thickness in a range from 0.5 μm to 1.0 μm.

Figure 2E:
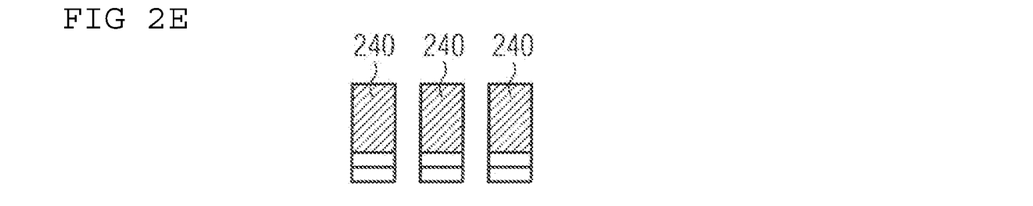

FIG. 2E shows a cross-sectional side view representation of separated semiconductor chips 240 obtained after singulating the semiconductor wafer 200. The semiconductor chips 240 may be obtained by sawing the semiconductor wafer 200 along sawing streets.

One possible disadvantage of the method, as depicted FIGS. 2A-E, may be the fact that in the process of sawing the semiconductor wafer 200 the solder interconnect layer 230 or particles thereof might be pulled onto or might otherwise reach the side faces of the insulating layer 220 and even the side faces of the semiconductor die 210 and thus might be able to cause leakage currents or short circuits. In the following another example of a method will be shown with which this disadvantage might be avoided.

Figure 3A:
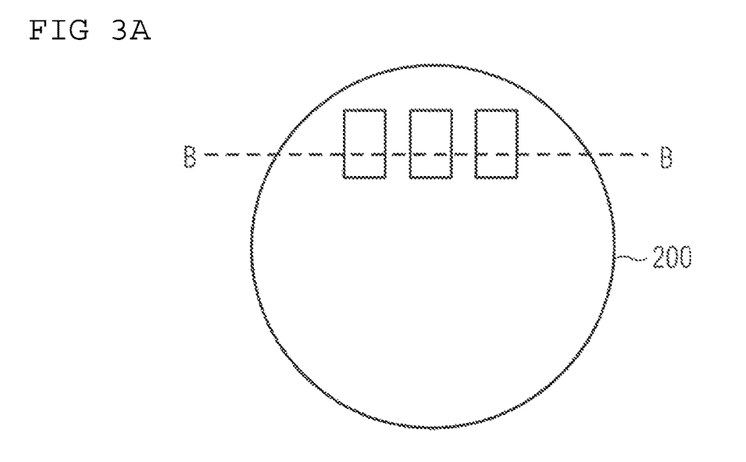
FIGS. 3A-E show schematic cross-sectional side view representations to illustrate an example of a method for fabricating a semiconductor chip so that the semiconductor chip can be attached to a carrier in an electrically insulating manner wherein a circumferential edge portion underneath the semiconductor dies is not covered by the solder interconnect layer.
Figure 3B:
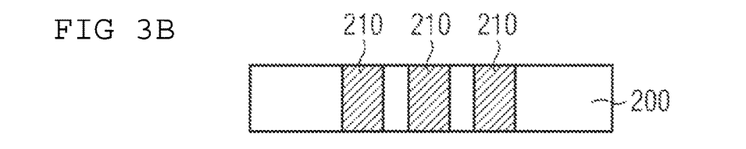
Figure 3C:
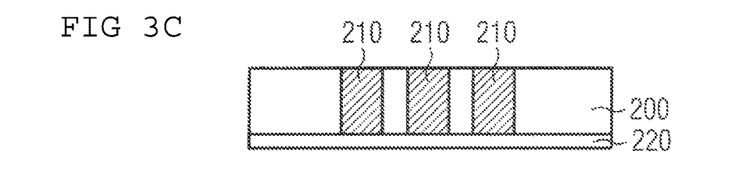

FIGS. 3A-C correspond to FIGS. 2A-C so that the description will not be repeated here.

Figure 3D:
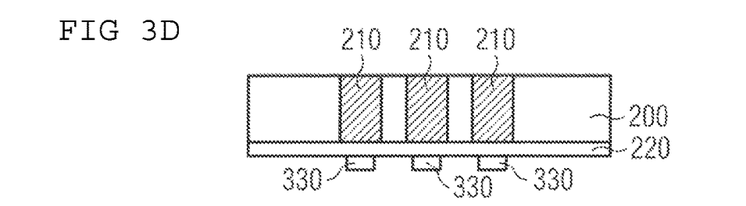

FIG. 3D shows a cross-sectional side view representation of the wafer 200 after depositing a structured solder interconnect layer 330. The solder interconnect layer 330 is structured in such a way that it covers only a central portion below each one of the semiconductor dies 210 so that, as a result, a circumferential edge portion of the insulating layer 220 below each one of the semiconductor dies is not covered by the solder interconnect layer 330.

Figure 3E:
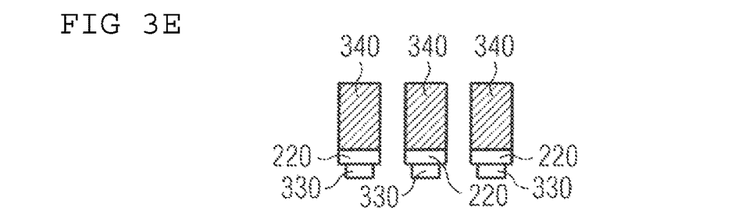

FIG. 3E shows again the separated semiconductor chips 340 after singulating the semiconductor wafer 200. It can clearly be seen that the solder interconnect layer 330 is not applied onto a circumferential edge portion of the insulating layer 220. With this measure it can be avoided that parts or particles of the solder interconnect layer 330 are conveyed or pulled onto the side faces of the insulating layer 220 or even the semiconductor die 210.

Figure 4:
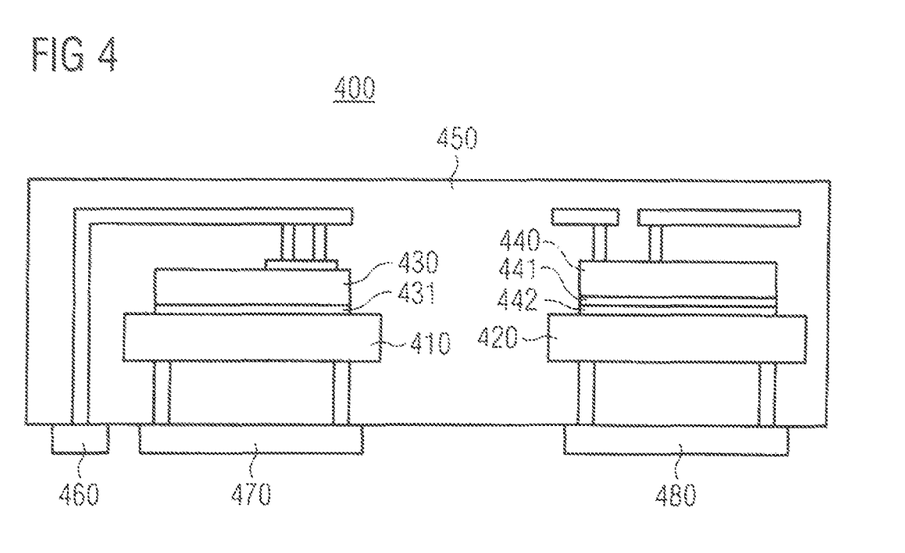
FIG. 4 shows a schematic cross-sectional side view representation of an electronic device according to an example.

FIG. 4 shows a schematic cross-sectional side view representation of an electronic device according to an example. The electronic device 400 of FIG. 4 comprises a first carrier 410, a second carrier 420, a first semiconductor die 430 comprising at least one electrical contact element (not shown) on each one of two opposing main faces, and a second semiconductor die 440 comprising a first main face and a second main face opposite to the first main face and at least one electrical contact element (not shown) on the first main face. The first semiconductor die 430 is arranged on the first carrier 410 in such away that a first solder interconnect layer 431 is disposed between one of the main faces of the first semiconductor die 430 and the first carrier 410. The second semiconductor die 440 is arranged on the second carrier 420 in such a way that an insulating layer 441 is applied onto the second main face of the second semiconductor die 440 and a second solder interconnect layer 442 is disposed between the insulating layer 441 and the second carrier 420.

The first and second carriers 410 and 420 and the first and second semiconductor dies 430 and 440 can be embedded in a mold material 450. Furthermore, the first and second carriers 410 and 420 can be part of or originate from one and the same leadframe. The first and second carriers 410 and 420 and the contact elements of the first and second semiconductor dies 430 and 440 can be connected to external contact elements 460, 470 and 480 which can be used to connect the electronic device 400 to a printed circuit board (PCB) or to any other substrate.

Further examples and embodiments of the electronic device 400 of FIG. 4 can be formed along the examples and embodiments as well described above in connection with one of FIGS. 1 to 3.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A method for fabricating an electronic device, the method comprising:
providing a first semiconductor chip, the first semiconductor chip comprising a first semiconductor die having a first electrical contact element arranged on a first main face of the first semiconductor die and a second electrical contact element arranged on a second main face of the first semiconductor die opposite to the first main face, and a first solder interconnect layer applied directly to the second main face and the second contact element of the first semiconductor die;
providing a second semiconductor chip, the second semiconductor chip comprising a second semiconductor die having an electrical contact element arranged on a first main face of the first semiconductor die and a second main face opposite to the first main face and which is devoid of electrical contact elements, an insulating layer applied directly to the second main face of the second semiconductor die, and a second solder interconnect layer applied directly to the insulating layer so that the second solder interconnect layer is separated from the entire second main face of the semiconductor die by the insulating layer;
attaching the first semiconductor chip to a first carrier directly via the first solder interconnect layer; and
attaching the second semiconductor chip to a second carrier directly via the second solder interconnect layer.

2. The method of claim 1, wherein the first semiconductor die comprises one or more of a power transistor, a vertical transistor, an insulated gate bipolar (IGB) transistor and a vertical diode.

3. The method of claim 1, wherein the second semiconductor die comprises one or more of a logic integrated circuit, a control circuit and a circuit configured to control a transistor.

4. The method of claim 1, wherein the insulating layer has a thickness in a range from 0.5 μm to 2 μm.

5. The method of claim 1, wherein one or more of the first and second solder interconnect layers has a thickness in a range from 0.5 μm to 1.0 μm.

6. The method of claim 1, further comprising:
attaching the first and second semiconductor chips simultaneously in one and the same process step.

7. A method for fabricating semiconductor chips, the method comprising:
providing a plurality of semiconductor dies on a semiconductor wafer, the semiconductor dies each comprising a first main face, at least one electrical contact element on the first main face, and a second main face opposite to the first main face and which is devoid of any electrical contact elements;
applying an insulating layer directly onto the second main faces of the semiconductor dies;
applying a solder interconnect layer directly onto the insulating layer, the solder interconnect layer being separated from the entire second main face of each semiconductor die by the insulating layer; and
singulating the semiconductor wafer to obtain a plurality of separated semiconductor chips.

8. The method of claim 7, the insulating layer is applied to an entire main face of the semiconductor wafer.

9. The method of claim 7, wherein the solder interconnect layer is applied to an entire main face of the in layer.

10. The method of claim 7, wherein the solder interconnect layer is applied to the insulating layer such that a circumferential edge portion of the insulating layer below each one of the semiconductor dies is not covered by the solder interconnect layer.

* * * * *

UNITED STATES PATENT AND TRADEMARK OFFICE
CERTIFICATE OF CORRECTION

PATENT NO. : 9,881,909 B2
APPLICATION NO. : 14/926892
DATED : January 30, 2018
INVENTOR(S) : M. Bauer et al.

It is certified that error appears in the above-identified patent and that said Letters Patent is hereby corrected as shown below:

In the Claims

Column 8, Line 28 (Claim 8, Line 1) please change "7, the" to -- 7, wherein the --

Column 8, Line 31 (Claim 9, Line 2) please change "the in layer" to -- the insulating layer --

Signed and Sealed this
Twentieth Day of March, 2018

Andrei Iancu
*Director of the United States Patent and Trademark Office*